US012578292B2

(12) United States Patent
Huber et al.

(10) Patent No.: US 12,578,292 B2
(45) Date of Patent: Mar. 17, 2026

(54) SENSOR ELEMENT FOR TESTING A DATA CARRIER HAVING A SPIN RESONANCE FEATURE, DIVIDING METHOD, MOUNTING METHOD AND TESTING METHOD

(71) Applicant: GIESECKE+DEVRIENT CURRENCY TECHNOLOGY GMBH, Munich (DE)

(72) Inventors: Stephan Huber, Munich (DE); Christian Schuller, Erharting (DE); Thomas Happ, Munich (DE)

(73) Assignee: GIESECKE+DEVRIENT CURRENCY TECHNOLOGY GMBH, Munich (DE)

( * ) Notice: Subject to any disclaimer, the term of this patent is extended or adjusted under 35 U.S.C. 154(b) by 164 days.

(21) Appl. No.: 18/699,988

(22) PCT Filed: Oct. 19, 2022

(86) PCT No.: PCT/EP2022/025477
§ 371 (c)(1),
(2) Date: Apr. 10, 2024

(87) PCT Pub. No.: WO2023/066523
PCT Pub. Date: Apr. 27, 2023

(65) Prior Publication Data
US 2024/0402105 A1 Dec. 5, 2024

(30) Foreign Application Priority Data
Oct. 21, 2021 (DE) ..................... 10 2021 005 253.6

(51) Int. Cl.
*G01N 24/10* (2006.01)
*G01R 33/383* (2006.01)
*G07D 7/04* (2016.01)

(52) U.S. Cl.
CPC ........... *G01N 24/10* (2013.01); *G01R 33/383* (2013.01); *G07D 7/04* (2013.01)

(58) Field of Classification Search
None
See application file for complete search history.

(56) References Cited

U.S. PATENT DOCUMENTS 5,149,946 A 9/1992 Jerome et al.
5,680,086 A 10/1997 Allis et al.
(Continued)

FOREIGN PATENT DOCUMENTS

CN 203931702 U 11/2014
DE 3408086 A1 9/1985
(Continued)

OTHER PUBLICATIONS

German Search Report from corresponding German Patent Application No. DE102021005253.6, Sep. 20, 2022.
(Continued)

*Primary Examiner* — Rodney E Fuller
(74) *Attorney, Agent, or Firm* — Workman Nydegger

(57) ABSTRACT

A sensor element for testing a planar data carrier having a spin resonance feature. The sensor element comprises a magnetic core having an air gap, and at least one dividing gap, along which the magnetic core is divisible into two or more parts. The sensor element includes a polarization device for generating a static magnetic flux in the air gap. The magnetic core has at least one magnetic potentiometer switchable between two states. A first state has a first magnetic reluctance and, in the first state of the magnetic potentiometer, the sensor element is set up for a measurement on a spin resonance feature of a data carrier introduced into the air gap, A second state has a second, different magnetic reluctance and, in the second state of the magnetic (Continued)

potentiometer, the sensor element is set up for a division of the magnetic core along the dividing gap.

18 Claims, 6 Drawing Sheets

(56)                    References Cited

U.S. PATENT DOCUMENTS

|  |  |  |  |  |
|---|---|---|---|---|
| 8,155,423 B2 * | 4/2012 | Kagehiro | ............... | G07D 11/30 |
|  |  |  |  | 235/379 |
| 2004/0260649 A1 | 12/2004 | Kagehiro et al. |  |  |
| 2024/0045010 A1 | 2/2024 | Huber et al. |  |  |

FOREIGN PATENT DOCUMENTS

| | | | | | |
|---|---|---|---|---|---|
| DE | 69419096 | T2 | 10/1999 | | |
| DE | 60309299 | T2 | 6/2007 | | |
| DE | 102020007707 | A1 | 6/2022 | | |
| JP | H10340809 | A | * 12/1998 | | |
| JP | 2006128234 | A | 5/2006 | | |
| RU | 2687230 | C1 | * 5/2019 | ............... | H01F 7/16 |
| SU | 1054752 | A1 | 11/1983 | | |
| WO | 9605522 | A2 | 2/1996 | | |
| WO | WO-2022199892 | A1 | * 9/2022 | ............... | G07D 7/04 |

OTHER PUBLICATIONS

International Search Report from corresponding PCT Application No. PCT/EP2022/025477, Feb. 15, 2023.

* cited by examiner

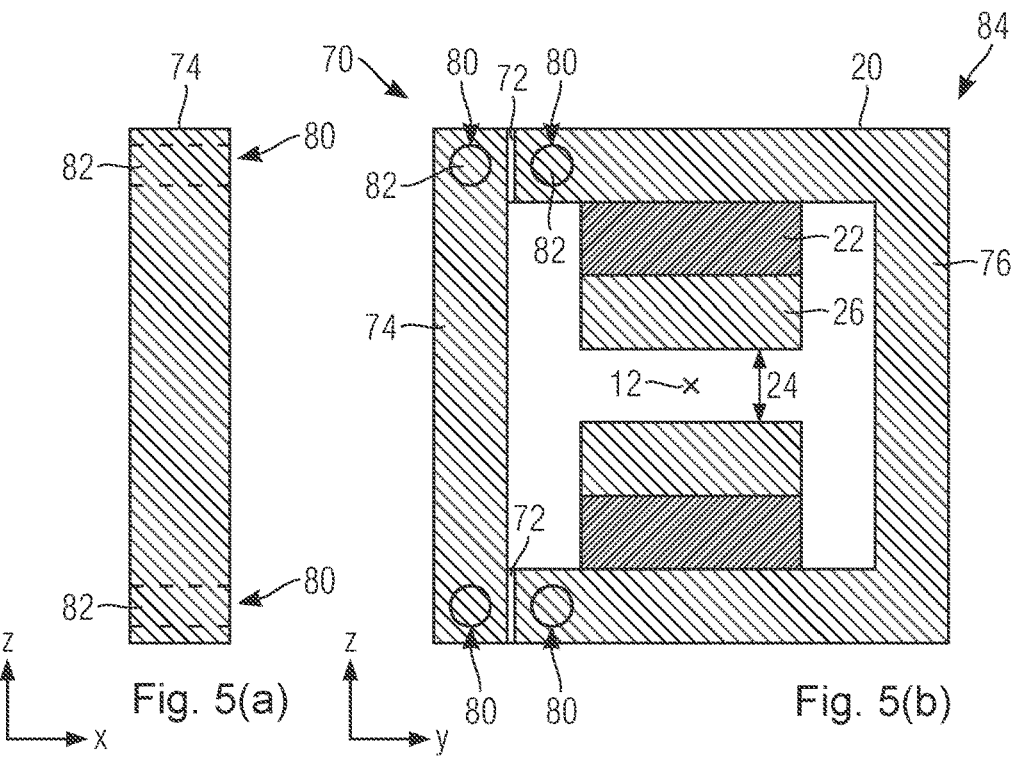
Fig. 5(a)          Fig. 5(b)
Fig. 5
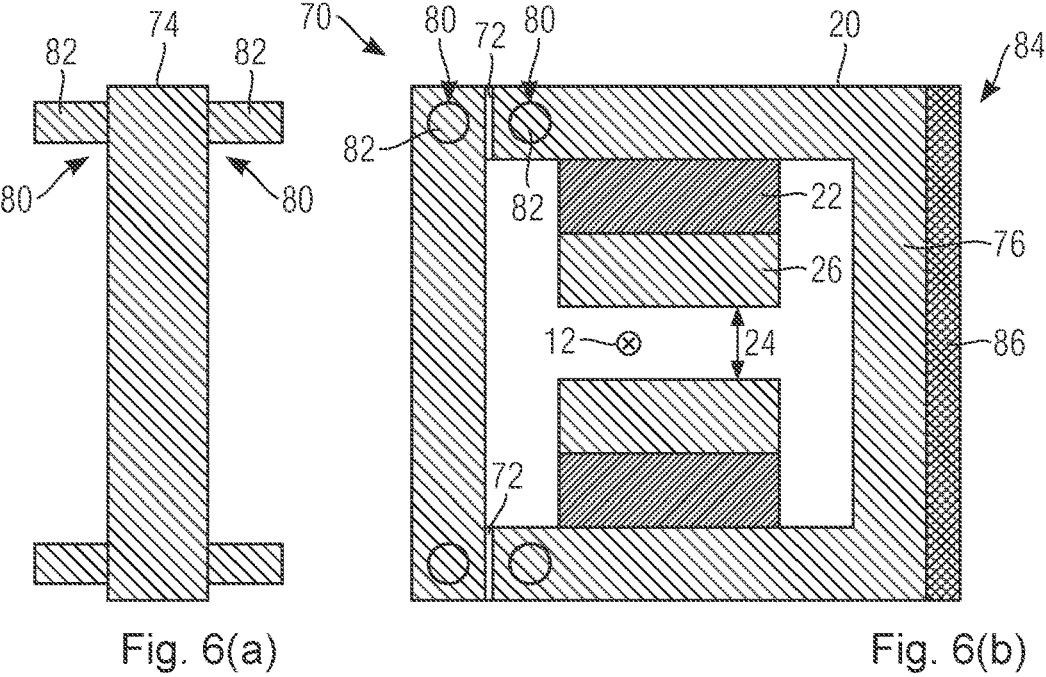
Fig. 6(a)          Fig. 6(b)
Fig. 6

SENSOR ELEMENT FOR TESTING A DATA CARRIER HAVING A SPIN RESONANCE FEATURE, DIVIDING METHOD, MOUNTING METHOD AND TESTING METHOD

FIELD OF THE INVENTION

The invention relates to a sensor element for the inspection of a planar data-carrier, in particular a banknote, having a spin-resonance feature. The invention also relates to a method for disassembling such a sensor element, to a method for assembling such a sensor element, and to a method for inspecting a planar data-carrier having a spin-resonance feature by means of such a sensor element.

BACKGROUND

For the purpose of validation, data-carriers—such as valuable documents or identity documents, but also other items of value such as trademarked goods—are often provided with security elements that permit an examination of the authenticity of the data-carriers and that serve at the same time as protection against unauthorized reproduction. In connection with the inspection of authenticity by machine, it is known to employ security elements having spin-resonance features for the purpose of validating documents and other data-carriers. For this purpose, the security elements have been provided with substances that exhibit a spin-resonance signature. Spin-resonance signatures that are capable of being employed for the inspection of authenticity include, in particular, nuclear magnetic resonance (NMR) effects, electron spin resonance (ESR) effects and ferromagnetic or ferrimagnetic resonance (FMR) effects.

In connection with the inspection of banknotes, three different magnetic fields within the range of measurement of a banknote-processing machine, for instance, are usually generated for the purpose of detecting the spin-resonance signatures. In concrete terms, it is a question of a quasistatic polarization field $B_0$ which extends parallel to the axial direction (z-direction) of the air gap of a magnetic circuit. A second magnetic field is constituted by a modulation field $B_{mod}$ which likewise extends parallel to the z-axis and typically has a frequency $f_{mod}$ within the kHz range. For the purpose of exciting transitions between the split spin-energy levels of the spin-resonance-signature substances, an excitation field $B_1$ has been provided which is polarized perpendicular to the $B_0$ direction. The excitation field oscillates at the resonant frequency of the material, which is also designated as the Larmor frequency and which is proportional to the polarization field $B_0$. In NMR applications, the Larmor frequency is typically less than 100 MHz, whereas in ESR and FMR applications the Larmor frequency is typically greater than 1 GHz.

For the purpose of generating the polarization field $B_0$, a magnetic circuit frequently comes into operation which conducts the magnetic flux of permanent magnets and/or coils to the air gap in which the inspection of banknotes takes place. The measured signal strength of the spin resonance increases approximately quadratically with the field strength $B_0$, so that the polarization field is advantageously maximized for the measurement. However, a greater polarization field $B_0$ also results in greater forces and stray fields between the individual components of the magnetic circuit, which may be problematic, particularly in the case of circuits of permanent magnets. If, for instance, the magnetic circuit has to be put together or disassembled for assembly tasks, maintenance tasks or installation tasks, the work is made difficult by the large forces acting, and/or may represent a hazard.

A further hazard may arise if the magnetic circuit is disassembled into its individual parts and stored. In this case, magnetic stray fields arise in the environment of the components of the circuit, the strength of which increases with increasing polarization field $B_0$. Magnetizable parts are attracted by these stray fields, making storage difficult.

SUMMARY

Proceeding from this, the object underlying the invention is to specify an improved sensor element for the inspection of a planar data-carrier having a spin-resonance feature, it being possible for said sensor element to be put together and disassembled easily and securely, and to be stored securely in a disassembled state.

The invention provides a sensor element for the inspection of a planar data-carrier having a spin-resonance feature. The planar data-carrier may be, for instance, a banknote that is subjected to an inspection of authenticity. The sensor element contains a magnetic core with an air gap into which the planar data-carrier is capable of being inserted for the purpose of inspection. The magnetic core also contains at least one disassembly gap along which the magnetic core is capable of being disassembled into two or more parts. The sensor element further contains a polarizing device for generating a static magnetic flux in the air gap.

A special feature provided in the sensor element is that the magnetic core exhibits at least one magnetic potentiometer capable of being switched between two states, wherein in a first state the magnetic potentiometer exhibits a first magnetic reluctance, and in the first state of the magnetic potentiometer the sensor element has been set up for a measurement in respect of a spin-resonance feature of a data-carrier inserted into the air gap, and in a second state the magnetic potentiometer exhibits a second magnetic reluctance, different from the first magnetic reluctance, and in the second state of the magnetic potentiometer the sensor element has been set up for a disassembly of the magnetic core along the disassembly gap.

The at least one magnetic potentiometer has advantageously been configured in such a way that in the first state it has substantially no influence on the magnetic flux in the air gap.

The disassembly force for disassembling the magnetic core along the at least one disassembly gap in the second state is advantageously at least 20%, in particular at least 40%, smaller than the disassembly force in the first state.

In a preferred configuration there is provision that for a disassembly of the magnetic core a magnetic conductor with a magnetic reluctance $R_{ref}$ has to be bridged with the aid of a magnetic potentiometer, the magnetic potentiometer being connected in parallel to the conductor to be bridged.

The magnetic potentiometer in the first state advantageously exhibits a magnetic reluctance $R_P$ of at least $10*R_{ref}$. The magnetic reluctance $R_P$ in the first state is preferentially even greater than $20*R_{ref}$ or $50*R_{ref}$. Alternatively or additionally, the magnetic potentiometer in the second state exhibits a magnetic reluctance $R_P$ of at most $3*R_{ref}$. The magnetic reluctance $R_P$ in the second state is preferentially even less than $2*R_{ref}$ or $1*R_{ref}$.

In another configuration which is likewise preferred, there is provision that for a disassembly of the magnetic core a magnetic conductor with a magnetic reluctance $R_{ref}$ has to be switched to be flux-free with the aid of a magnetic potentiometer, the magnetic potentiometer being connected in series to the conductor to be switched to be flux-free.

The magnetic potentiometer in the first state advantageously exhibits a magnetic reluctance $R_P$ of at most $\frac{1}{3} * R_{ref}$. The magnetic reluctance $R_P$ in the first state is preferentially even less than $\frac{1}{5} * R_{ref}$ or $\frac{1}{10} * R_{ref}$. Alternatively or additionally, the magnetic potentiometer in the second state exhibits a magnetic reluctance $R_P$ of at least $3 * R_{ref}$. The magnetic reluctance $R_P$ in the second state is preferentially even greater than $5 * R_{ref}$ or $10 * R_{ref}$.

According to an advantageous configuration, there is provision that in the second state of the magnetic potentiometer the magnetic flux through the air gap has been changed by more than 5% in comparison with the magnetic flux in the first state, and/or that the field homogeneity in the air gap has been diminished by more than 10%. This permits a particularly large reduction of the disassembly force.

Two or more magnetic potentiometers, in particular magnetic potentiometers of different types, have advantageously been provided in the sensor element. This enables a considerable reduction of the disassembly force with, at the same time, a small physical size and easy mobility of the potentiometers. The magnetic potentiometers of the types described more precisely in the following preferentially enter into consideration.

According to an advantageous configuration, at least one magnetic potentiometer of the magnetic core includes two spaced magnetic conductors and a magnetic flux-conducting part which extends with variable length within the free space between the two conductors in order to generate a variable magnetic reluctance, depending on the length of the flux-conducting part. The magnetic flux-conducting part may be, for instance, a magnetic cylinder and may be constituted, in particular, by a displaceable bolt or a threaded rod. The length of the flux-conducting part in the free space may vary between zero and the spacing of the magnetic conductors. The two aforementioned states of the magnetic potentiometer with differing reluctance may be constituted by a position of, respectively, minimum and maximum length of the flux-conducting part in the free space. This embodiment permits a particularly intense diminution of the disassembly force.

According to another advantageous configuration, at least one magnetic potentiometer of the magnetic core includes two spaced magnetic conductors and a flux-conducting part extending between the conductors with an enclosed magnetic modification element that is capable of being variably positioned in the flux-conducting part in order to generate a variable magnetic reluctance, depending on the position of the modification element in the flux-conducting part. The magnetic modification element may be, for instance, a magnetic cylinder which can be inserted or screwed more or less far into a corresponding bore of the flux-conducting part. The two aforementioned states of the magnetic potentiometer with differing reluctance may be constituted by a, respectively, minimally or maximally inserted position of the modification element in the flux-conducting part. This embodiment is particularly stable mechanically.

According to another advantageous configuration, at least one magnetic potentiometer of the magnetic core includes two spaced magnetic conductors and a flux-conducting part extending between the conductors that is capable of being combined with a magnetic modification plate in order to generate a variable magnetic reluctance, depending on the presence or absence of the modification plate. This embodiment is particularly simple mechanically.

The stated elements of the magnetic potentiometers—in particular, the magnetic flux-conducting parts, the modification element or the modification plate—have advantageously been formed using materials of high relative permeability $\mu_r$. The materials preferentially have a relative permeability $\geq 50$; materials with a relative permeability $\geq 200$ are particularly preferred. Furthermore, the stated elements have preferentially been formed from a material having a high saturation flux density, in particular $B_S \geq 1.0$ T or even $B_S \geq 1.8$, in order to avoid a saturation and therefore a fall in permeability in the case of high magnetic field strengths. Advantageous materials are soft-magnetic materials such as SiFe alloys and NiFe alloys, CoFe alloys, soft iron or magnetic steels with a carbon content below 0.55%.

Magnetic potentiometers may have been arranged with advantage alongside a disassembly gap of the magnetic core; in particular, two magnetic potentiometers may have been arranged on either side of a disassembly gap. This position is readily accessible for an adjustment. Magnetic potentiometers may also have been arranged with advantage in such a way that they are able to generate a shunt between the legs and/or yokes of the magnetic core and the pole shoes and/or permanent magnets of the magnetic core. This enables a particularly intense reduction of the disassembly force.

In an advantageous configuration, the sensor element further exhibits a modulation coil, for generating a temporally varying magnetic field in the air gap, and a resonator for exciting the spin-resonance feature of the data-carrier to be inspected. The resonator has also been designed, in particular, to detect the signal response of the spin-resonance feature, and it can advantageously receive the signal response of the spin-resonance feature and output it to a detector.

The sensor element preferably further includes an evaluation unit that has been set up to generate an inspection result on the basis of the signal response of the spin-resonance feature detected by the resonator. For this purpose, a characteristic property derived from the signal response is preferably compared with a reference value or with a reference interval, and in the case of sufficiently high concordance a positive inspection result is output which indicates, for example, the authenticity or a class affiliation of the inspected valuable document. The resonant frequency of the spin resonance, the line width or amplitude thereof, a relaxation-time of the spin resonance or the spatial distribution of the spin-resonance feature, for instance, may be drawn upon as characteristic properties.

The spin resonances can be determined, for instance, with a continuous wave (CW) method, with a pulsed method or with a rapid-scan method.

The invention also encompasses a method for disassembling a sensor element of the described type, in which the at least one magnetic potentiometer of the magnetic core is brought into the second state and the magnetic core is disassembled along the at least one disassembly gap. If the sensor element contains several magnetic potentiometers, all the potentiometers are advantageously brought into the second state, in order to obtain the greatest possible reduction of the disassembly force.

The invention further encompasses a method for assembling a sensor element of the described type. In the course of the method, a first portion of the magnetic core is made available that exhibits at least a part of the stated polarizing device for generating the static magnetic flux and that exhibits at least one magnetic potentiometer capable of being switched between two states, which is in the second state or is brought into the second state. Furthermore, a second portion of the magnetic core is made available. The magnetic core of the sensor element is assembled from the first and second portions, so that, on the one hand, an air gap is formed in the magnetic core, in which a static magnetic flux is generated by the polarizing device, and, on the other hand, at least one disassembly gap is formed between the portions. After the assembly of the magnetic core, the at least one magnetic potentiometer is brought into the first state in order to set up the sensor element for a measurement in respect of a spin-resonance feature of a data-carrier inserted into the air gap.

If the sensor element contains several magnetic potentiometers, the specified steps are advantageously carried out for all the magnetic potentiometers. The second portion of the magnetic core may also exhibit a part of the stated polarizing device for generating the static magnetic flux and may exhibit at least one magnetic potentiometer capable of being switched between two states. In this case, the specified steps are advantageously carried out also for the magnetic potentiometers of the second portion. For instance, the sensor element has been set up for a measurement of spin resonance only when all the magnetic potentiometers of the magnetic core are in the first state.

Finally, the invention also encompasses a method for inspecting a planar data-carrier, in particular a banknote, having a spin-resonance feature by means of a sensor element of the described type. In this method, an inspection takes place as to whether the at least one magnetic potentiometer of the magnetic core is in the first state, and if this is not the case the at least one magnetic potentiometer is brought into the first state. A planar data-carrier to be inspected is then inserted into the air gap of the magnetic core, and a measurement of spin resonance in respect of the data-carrier is performed.

BRIEF DESCRIPTION OF THE DRAWINGS

Further exemplary embodiments, as well as advantages of the invention, will be elucidated below with reference to the figures, in the representation of which a true-to-scale and proportional reproduction has been dispensed with, in order to enhance clarity.

FIGS. 4(a) and 4(b), shows equivalent magnetic-circuit diagrams for the sensor element shown in FIGS. 1 and 2, wherein FIG. 4(a) shows the complete equivalent magnetic-circuit diagram, and FIG. 4(b) shows for $R_P \gg R_Z$ the idealized equivalent circuit diagram in normal operation shown in FIG. 1, FIG. 5, including FIGS. 5(a) and 5(b), shows schematically a sensor element according to a further exemplary embodiment of the invention in normal operation, wherein FIG. 5(a) shows the side view of the sensor element in the x/z-plane, and FIG. 5(b) shows the side view in the y/z-plane, FIG. 6, including FIGS. 6(a) and 6(b), shows in FIG. 6(a) and FIG. 6(b) the sensor element shown in FIG. 5 with the same views in the inoperable state.

DETAILED DESCRIPTION OF VARIOUS EMBODIMENTS

Figure 1:
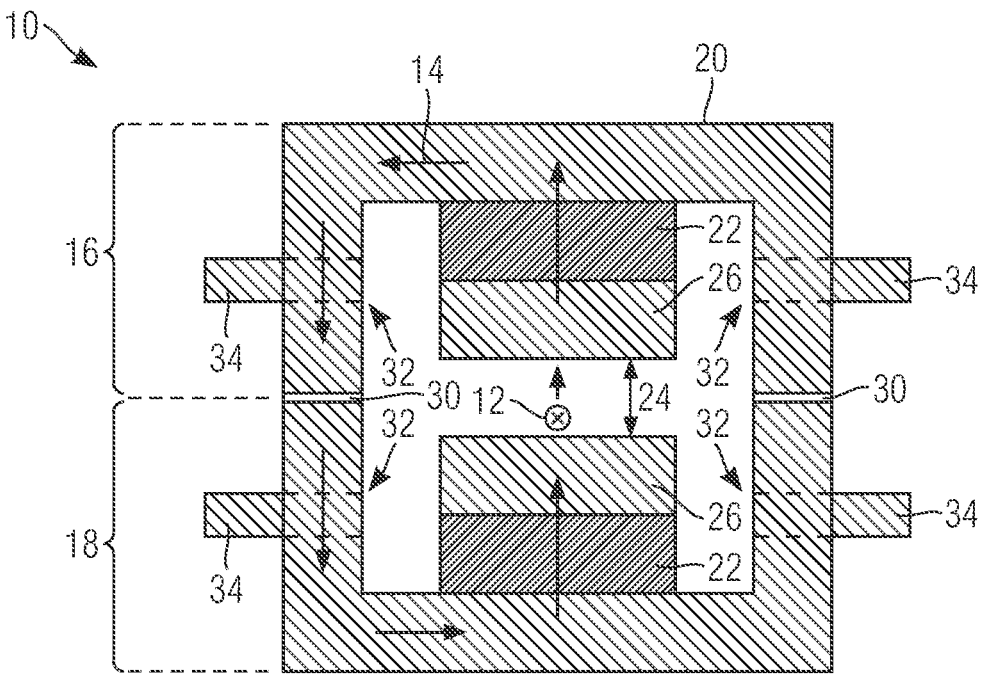
FIG. 1 shows schematically the sensor element of an inspection apparatus, according to the invention, of a banknote-processing system in normal operation with the magnetic potentiometers switched to the first state.
Figure 2:
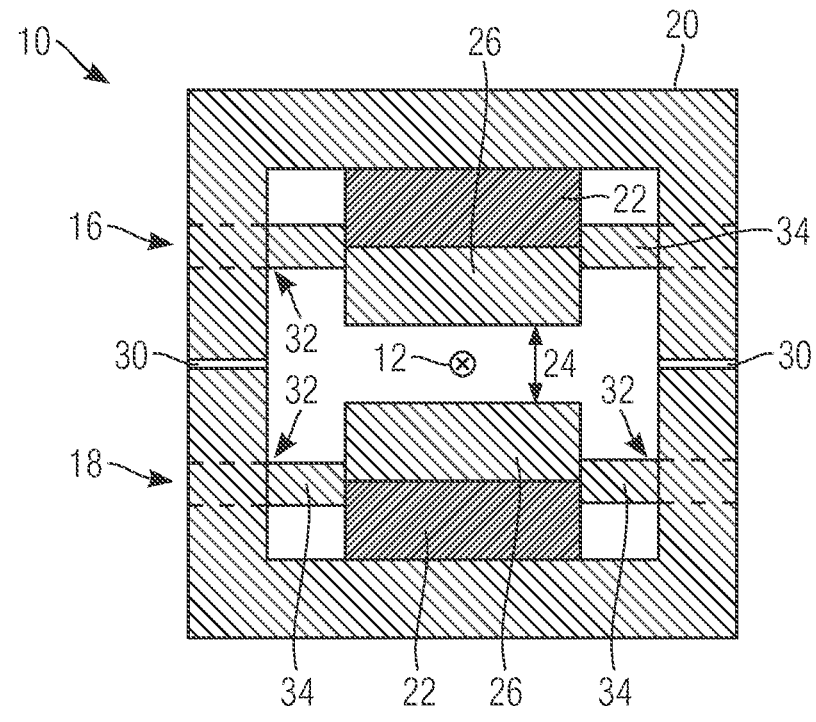
FIG. 2 shows the sensor element shown in FIG. 1 with the magnetic potentiometers for assembly tasks, maintenance tasks or installation tasks switched to the second state, FIG. 3, including

The invention will now be elucidated on the basis of an example constituted by sensor elements for the inspection of the authenticity of banknotes. For this purpose, FIGS. 1 and 2 show schematically the sensor element 10 of an inspection apparatus of a banknote-processing system. The banknote specimens, not themselves represented, contain, in a feature region, a spin-resonance feature, the characteristic properties of which serve, in particular, for demonstrating the authenticity of the banknote. The specimens are conducted along a transport path 12 through an air gap 24 of the sensor element 10, which in the representation shown in FIGS. 1 and 2 is perpendicular to the plane of the paper.

The sensor element 10 shown in FIGS. 1 and 2 contains a magnetic circuit which on account of its geometry is designated as an H-type circuit. The magnetic circuit includes a magnetic core 20 which conducts the magnetic flux of two permanent magnets 22 and, as a rule, of further coil elements, which for the sake of simplicity are not represented in the figure, to an air gap 24 which extends in the axial direction between the pole shoes 26 of the magnetic circuit and in which the measurement of spin resonance in respect of the banknote specimens takes place.

The magnetic core 20 constitutes a magnetic loopback for the magnetic flux 14 of the permanent magnets 22, which for the purpose of illustration has been sketched in FIG. 1 in the left half of the sensor element. The vertical loopback elements of the magnetic core 20 are designated as legs; the horizontal loopback elements are designated as yokes.

The magnetic core 20 further exhibits two disassembly gaps 30 at which the magnetic circuit can be separated for assembly tasks, maintenance tasks or installation tasks and can be disassembled into two circuit halves 16, 18.

As described in principle above, for a high signal strength in the course of the inspection of banknotes a high field strength of the polarization field $B_0$ in the air gap 24 is striven for. However, with increasing polarization field of the permanent magnets, the forces and stray fields between the individual components of the magnetic circuit also increase, which, on the one hand, make a disassembly of the sensor element difficult and, on the other hand, may also result in a hazard in the course of the storage of a magnetic circuit disassembled into its individual parts.

With a view to overcoming these problems, in the magnetic core 20 four magnetic potentiometers 32 have been provided which do not influence the normal operation of the sensor element in the course of the inspection of banknotes but which enable a significant reduction of the disassembly forces and stray fields.

The magnetic potentiometers 32 are each capable of being switched between two states, which are illustrated respectively in FIGS. 1 and 2. In the first state of the potentiometers 32 shown in FIG. 1, the sensor element 10 is in normal operation and has been set up for a measurement in respect of a spin-resonance feature of a banknote specimen in the air gap 24. In the second state of the potentiometers 32, which is illustrated in FIG. 2, a substantial part of the magnetic flux flows through the potentiometers 32 and thereby diminishes, besides the flux in the air gap 24, also in particular the flux in the disassembly gaps 30. As a result, the disassembly forces of the two circuit halves 16 and 18 have been distinctly reduced and permit an easier assembly or disassembly of the magnetic circuit.

Figures 3, 3A, 3B, 3C:
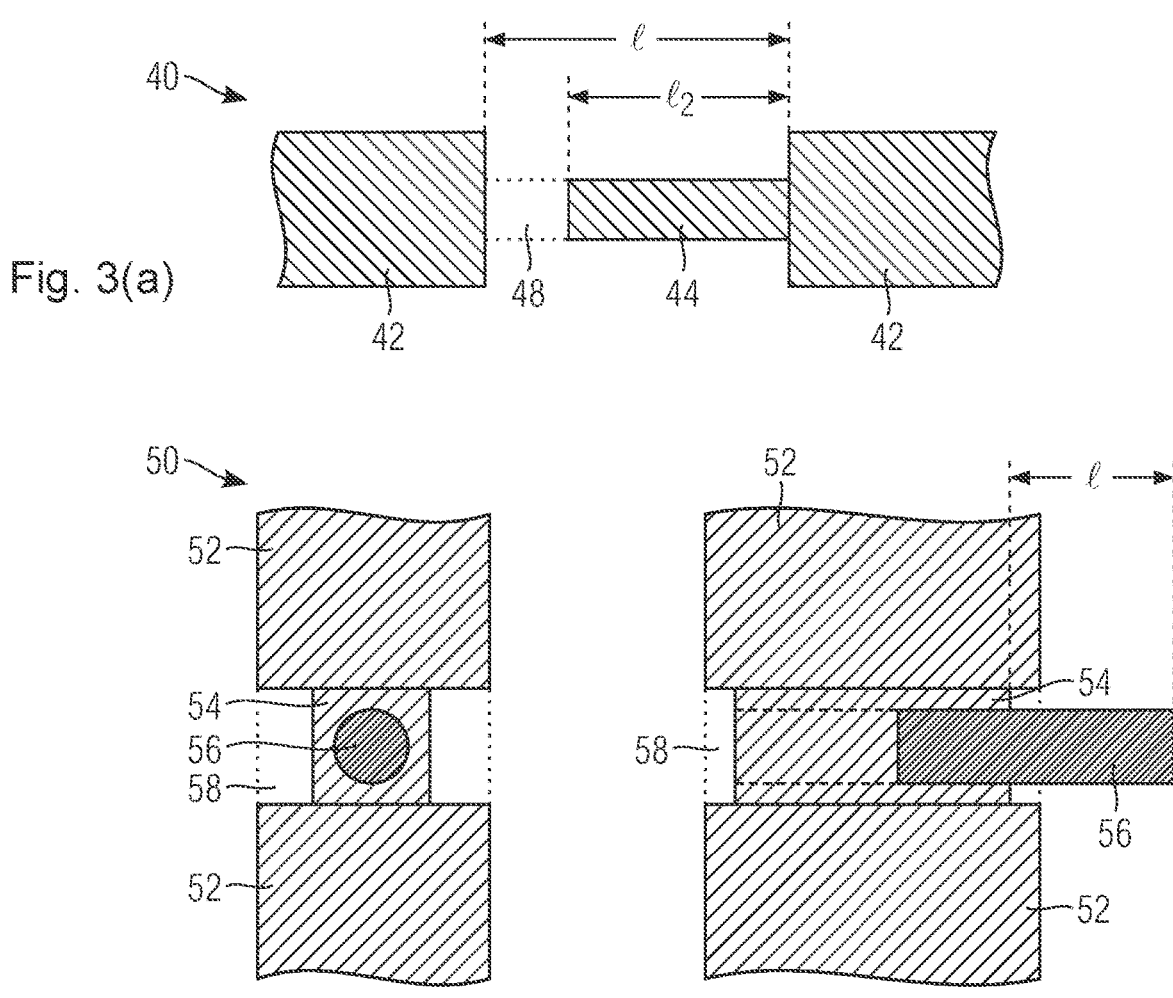
FIGS. 3(a) to 3(c), shows the structure and the mode of operation of a few magnetic potentiometers used in accordance with the invention, FIG. 4, including

In order to elucidate in greater detail how the magnetic flux is purposefully redirected with the aid of the magnetic potentiometers 32, the structure and the mode of operation of a few magnetic potentiometers used in accordance with the invention will firstly be described more precisely with reference to FIG. 3.

FIG. 3($a$) shows a first embodiment of a magnetic potentiometer 40 in which a magnetically conducting cylinder 44 with variable length $l_2$ and with cross-sectional area A extends between two magnetic conductors 42 arranged with a spacing l. The length $l_2$ of the cylinder 44 may generally be between 0 and l, so that, besides the magnetic cylinder 44, there is also a free space 48 of length $l_1=l-l_2$ between the conductors 42. If the relative permeability of the material of the cylinder 44 amounts to $\mu_2$ and if the relative permeability of the free space 48 is denoted by $\mu_1$, then the total magnetic reluctance of the potentiometer 40 formed between the outer conductors 42 is given approximately by $$R = l_1/(\mu_0\mu_1 A) + l_2/(\mu_0\mu_2 A) = (1-l_2)/(\mu_0\mu_1 A) + l_2/(\mu_0\mu_2 A)$$

where $\mu_0$ is the permeability of a vacuum.

The magnetic reluctance of the potentiometer 40 can consequently be set via the length 12 of the magnetically conducting cylinder 44. Since $\mu_2>\mu_1$ holds for magnetic materials, a maximum magnetic reluctance of the potentiometer 40 arises for $l_2=0$, and a minimum magnetic reluctance arises for $l_2=l$. In a sensor element, these two extreme values and the associated positions of the cylinder 44 may represent the two aforementioned states of differing magnetic reluctance of the magnetic potentiometer 40.

A second embodiment of a magnetic potentiometer 50 is shown in FIG. 3($b$), in front and side views. In the case of the potentiometer 50, a magnetic flux-conducting part 54 establishes a connection between an upper and a lower magnetic conductor 52. The flux-conducting part 54 has been formed from a material having relative permeability $\mu_2$ and encloses a cylinder 56, capable of being displaced in the longitudinal direction, of permeability $\mu_3>\mu_1$. The flux-conducting part 54 and the cylinder 56 are located in a free space 58 of relative permeability $\mu_1$, which, in particular, also fills out the bore in the flux-conducting part 54. The magnetic reluctance of the potentiometer 50 can be set by the position l of the cylinder 56 within the flux-conducting part 54. In particular, a maximum magnetic reluctance of the potentiometer 50 arises for $l=l_{max}$,—that is to say, for a cylinder 56 pushed out as far as possible—and a minimum magnetic reluctance arises for $l=0$—that is to say for a cylinder 56 fully inserted into the flux-conducting part 54. In a sensor element, these two extreme values and the associated positions of the cylinder 56 relative to the flux-conducting part 54 can be utilized as the two aforementioned states of differing magnetic reluctance of the potentiometer 50.

FIG. 3($c$) shows a further embodiment of a magnetic potentiometer 60. A flux-conducting part 64 of relative permeability $\mu_2$ connects two outer magnetic conductors 62. The relative permeability of the free space 68 is again denoted by $\mu_1$. By virtue of the addition of a modification plate 66 with relative permeability $\mu_3>\mu_1$, the magnetic reluctance between the two outer conductors 62 can be reduced. In a first state with added modification plate 66, the reluctance of the magnetic potentiometer 60 is therefore low; in a second state without modification plate 66, it is high.

In order to obtain two states with a difference in magnetic reluctance that is as large as possible with a small cross-section of the potentiometer elements, the potentiometers 40, 50, 60 have advantageously been formed using materials of high relative permeability $\mu_2$ or $\mu_3$. The relative permeability is preferentially ≥50. A relative permeability ≥200 is particularly preferred. In order to avoid a saturation and therefore a fall in permeability in the case of high magnetic field strengths, a material having a high saturation flux density is advantageously chosen; for instance, soft-magnetic materials with $B_S≥1.0$ T, such as SiFe alloys or NiFe alloys, or soft-magnetic materials even with $B_S≥1.8$ T, such as CoFe alloys, soft iron or magnetic steels with a carbon content below 0.55%.

Coming back to the representation in FIGS. 1 and 2, in each of the two halves of the magnetic circuit 16, 18 in the sensor element 10 two magnetic potentiometers 32 of the type of potentiometer 40 shown in FIG. 3($a$) have been provided. The magnetically conducting cylinders of the potentiometers are each constituted by soft-magnetic threaded rods 34 which have been unscrewed outward in the first state shown in FIG. 1, and screwed into the magnetic circuit in the second state shown in FIG. 2. As explained in connection with FIG. 3($a$), the magnetic reluctance of the potentiometers 32 is maximal in the first state (FIG. 1) and minimal in the second state (FIG. 2). In the second state shown in FIG. 2, the potentiometers therefore constitute a shunt within the magnetic circuit, which reduces the flux in the air gap 24 and in the disassembly gaps 30.

Figures 4, 4A, 4B:
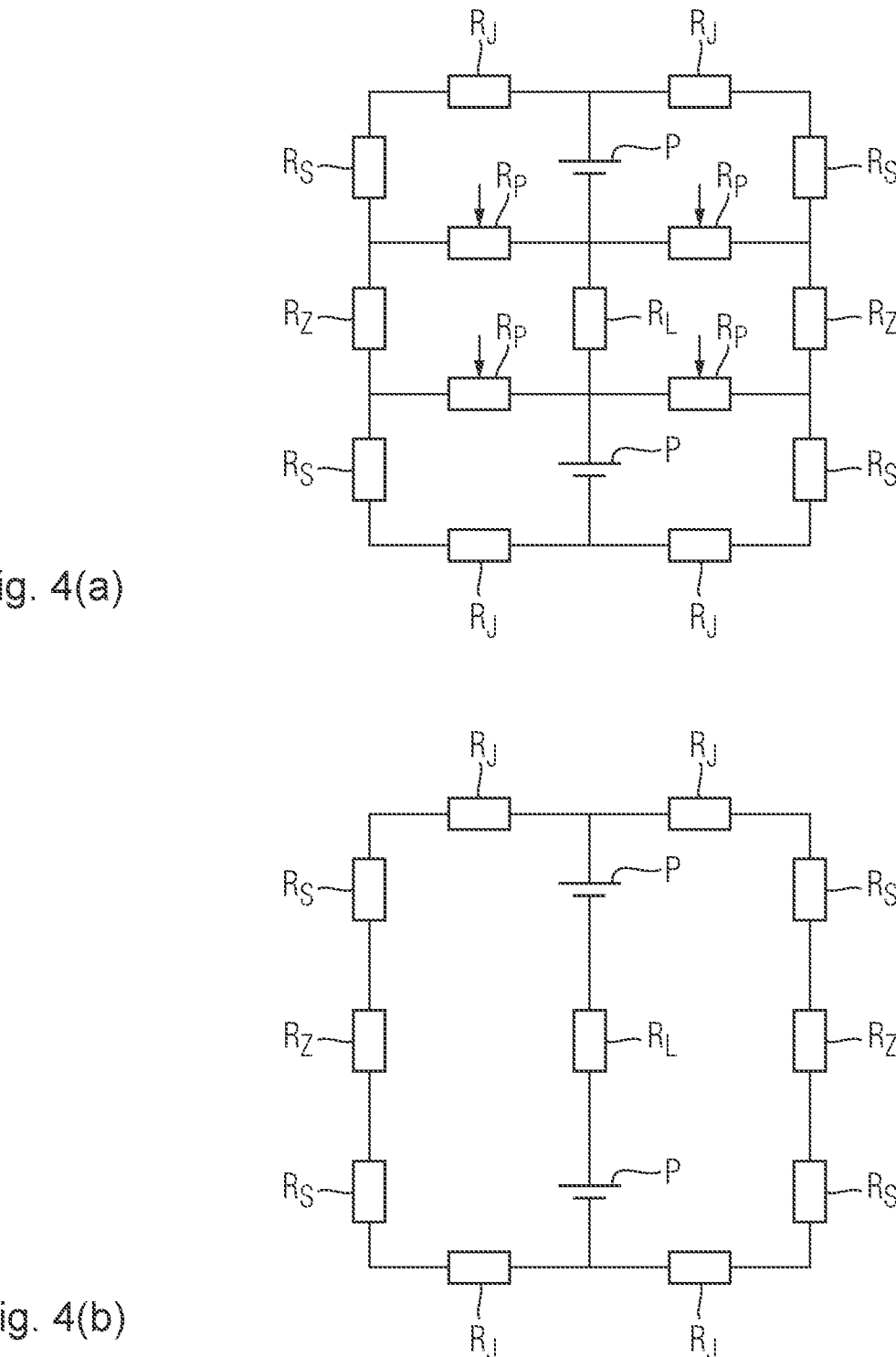

The reduction of the magnetic flux with the aid of the potentiometers 32 can be illustrated with the aid of equivalent magnetic-circuit diagrams. FIG. 4 shows in FIG. 4($a$) the complete equivalent magnetic-circuit diagram of the sensor element 10 shown in FIGS. 1 and 2, in which the permanent magnets 22 are considered to be voltage-sources P, and the magnetic elements of the magnetic circuit are shown as yoke resistors $R_J$, as leg resistors $R_S$, as resistors of the conductor elements at the disassembly gap $R_Z$, and as air-gap resistor $R_L$. The variable reluctances of the four potentiometers 32 are denoted by $R_P$. The pole shoes and possible coil elements have been disregarded, for the sake of simplicity.

At maximum magnetic reluctance of the potentiometers 32—that is to say, in the normal operating state shown in FIG. 1—$R_P>>R_Z$, so that practically no magnetic flux flows across the potentiometers 32. This state can therefore be described by the idealized equivalent circuit diagram shown in FIG. 4($b$), and it becomes clear that the magnetic flux in the air gap 24 is not disturbed by the magnetic potentiometers 32 in normal operation of the sensor element 10.

For assembly work or disassembly work, the threaded rods 34 are screwed into the magnetic circuit, the magnetic reluctance of the potentiometers 32 is thereby minimized, and the magnetic flux in the air gap 24 and in the disassembly gaps 30 is reduced by virtue of the shunt arising. Surprisingly, it has become evident that a potentiometer reluctance $R_P \approx 3 \cdot R_Z$ is already sufficient to reduce the disassembly force distinctly. A substantial part of the magnetic flux then flows through the magnetic potentiometers 32, while at the same time the flux in the air gap 24 and in the disassembly gaps 30 is reduced.

In addition to the diminution of the disassembly forces which facilitate assembly and disassembly of the magnetic circuit, the relocation of the magnetic flux from the air gap 24 or from the disassembly gaps 30 into the potentiometer elements 32 also advantageously has the consequence that slighter stray fields manifest themselves in the neighborhood of the circuit elements, as described in detail below.

Figure 7:
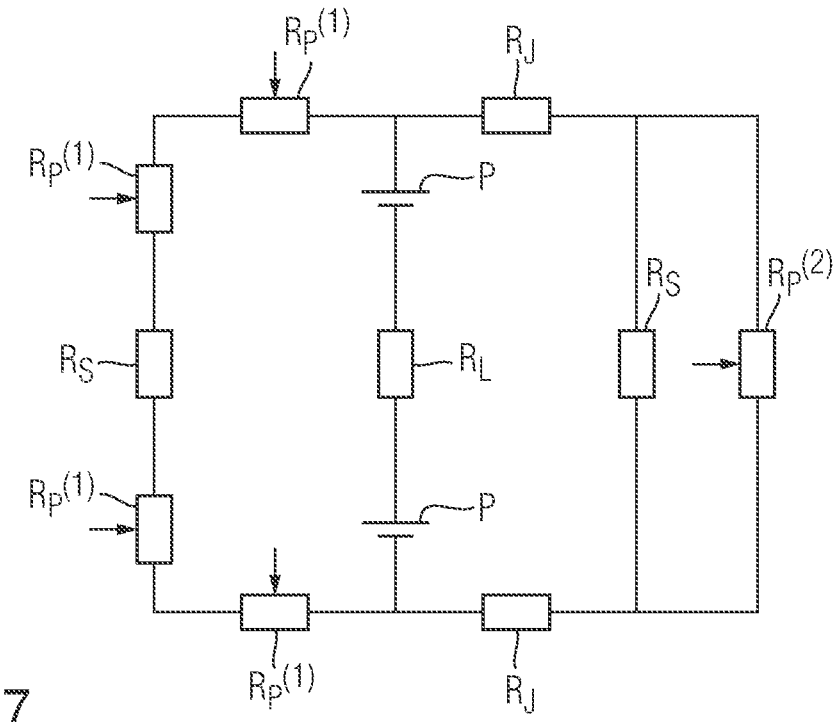
FIG. 7 shows the complete equivalent magnetic-circuit diagram of the sensor element shown in FIGS. 5 and 6.

A further exemplary embodiment of the invention will now be elucidated with reference to FIGS. 5 to 7. FIGS. 5 and 6 show a sensor element 70 according to the invention, respectively in (a) in side view in the x/z-plane and in (b) in side view in the y/z-plane. The sensor element 70 has been represented in normal operation in FIG. 5, and in FIG. 6 in the inoperable state that has been set up for disassembly. FIG. 7 shows the complete equivalent magnetic-circuit diagram of the sensor element 70.

The magnetic circuit of the sensor element 70 is likewise of H-type and contains, like the configuration shown in FIGS. 1 and 2, a magnetic core 20 with permanent magnets 22, with a magnetic loopback and with an air gap 24 extending between two pole shoes 26, in which the measurement of spin resonance takes place. The magnetic circuit contains disassembly gaps 72 which, however, have been arranged in the sensor element 70 in such a way that the original H-type circuit can be dismantled to become a C-type circuit by removal of the left circuit leg 74. This constitutes a frequently occurring task, above all in the course of maintenance work in banknote-processing machines. If, for instance, a banknote jam occurs in the machine, the transport path 12 in the air gap 24 becomes accessible as a result of the dismantling of the circuit leg 74, and the banknote jam can be eliminated more easily.

The magnetic core 20 of the sensor element 70 contains two different types of magnetic potentiometers 80, 84. On the one hand, in the immediate vicinity of the two disassembly gaps 72 two potentiometers 80 of the type described in FIG. 3(b) have been provided in each instance, which have been connected into the magnetic circuit in series. The displaceable cylinders of these potentiometers are constituted in the sensor element 70 by soft-magnetic threaded rods 82 which may have been screwed into the magnetic circuit (FIG. 5) or may have been largely unscrewed (FIG. 6). As explained in connection with FIG. 3(b), the magnetic reluctance of the potentiometers 80 is low in the first, screwed-in state shown in FIG. 5 but substantially greater in the second, unscrewed state shown in FIG. 6.

The series connection of the potentiometers 80 can be discerned particularly well in the equivalent magnetic-circuit diagram shown in FIG. 7, in which-besides the elements P, $R_J$ and $R_S$ already known from FIG. 4—the potentiometers 80 arranged at the disassembly gaps have been sketched as variable magnetic resistors $R_P^{(1)}$. The magnetic reluctance of the disassembly gap is not shown, for the sake of simplicity. The magnetic resistor $R_S$ of the leg 74, which has to be removed in the case of disassembly, naturally constitutes a suitable reference resistor for the magnitude of the potentiometer resistors $R_P^{(1)}$.

On the right leg of the magnetic core 20 a magnetic potentiometer 84 of the type described in FIG. 3(c) has been formed, the right leg 76 of the magnetic core performing the role of the flux-conducting part, and a removable soft-magnetic plate 86 (FIG. 6) performing the role of the modification plate. As shown in FIG. 7, the potentiometer 84 with magnetic resistor $R_P^{(2)}$ has been connected into the magnetic circuit in parallel.

In normal operation shown in FIG. 5, the threaded rods 82 of the potentiometers 80 have been fully screwed in; their series-connected magnetic reluctance $R_P^{(1)}$ is therefore low. On the other side, the soft-magnetic plate 86 of potentiometer 84 has been removed, so that the parallel-connected magnetic reluctance $R_P^{(2)}$ of potentiometer 84 is high, as explained in connection with FIG. 3(c). In normal operation of the sensor element 70, the magnetic flux in the air gap 24 is therefore not disturbed by the magnetic potentiometers 80, 84.

In the disassembly state shown in FIG. 6, the threaded rods 82 of the potentiometers 80 of the first type have been unscrewed; their series-connected magnetic reluctance $R_P^{(1)}$ is therefore high, so that they largely decouple the left circuit leg 74 with magnetic resistor $R_S$ from the magnetic flux. In the potentiometer 84 of the second type, the soft-magnetic plate 86 has now been attached, so that the parallel-connected magnetic reluctance $R_P^{(2)}$ of the potentiometer 84 is low and the magnetic flux is conducted away from the air gap 24 and from the left circuit leg 74. The left circuit leg 74 can therefore be easily removed for the maintenance work.

Instead of the soft-magnetic threaded rods and soft-magnetic plates shown in the embodiment examples for the purpose of illustration, use may also be made of other magnetic elements having high relative permeability, in particular soft-magnetic bolts, soft-magnetic cone elements and soft-magnetic wing elements.

Some advantageous properties of the sensor elements according to the invention will now be elucidated more precisely with the aid of simulations and comparative calculations.

First of all, the magnetic circuit of the sensor element 10 shown in FIGS. 1 and 2 was simulated. The magnetic circuit contains two NdFEB permanent magnets as well as a magnetic loopback and two pole shoes which have been formed from a soft-magnetic steel with a carbon content <0.19% and with a saturation magnetization of 2.05 T. The permanent magnets exhibit a remanence of 1.29 T and dimensions of 30 mm×60 mm×20 mm. Their magnetization is directed parallel to the z-axis. Without the magnetic potentiometers, the magnetic circuit has outer contours of 30 mm×140 mm×140 mm. The yokes and legs have a cross-section of 20 mm×30 mm. An air gap with a height of 20 mm is located in the center of the magnetic circuit along the z-axis.

The magnetic circuit contains, in addition, two disassembly gaps 30 which permit the circuit to be separated in the x/y-plane. In each of the two circuit legs two magnetic potentiometers 32 are located, each of the potentiometers 32 containing as cylindrical element a soft-magnetic bolt which has been formed from the same material as the loopback. The diameter of the soft-magnetic bolts amounts to 15 mm in each instance; its usable length amounts to 20 mm.

For this magnetic circuit, the disassembly force $F_Z$ was now calculated—that is to say, the force that is at least necessary to pull the upper circuit half 16 in the z-direction away from the lower circuit half 18. In addition, the $B_0$ flux density in the center of the air gap 24 was also determined. This flux density is directly proportional to the resonant frequency of the spin-resonance feature and is therefore decisive for the operability of the sensor element 10. All the calculations were performed in each instance for the two states of the potentiometers 32 represented in FIGS. 1 and 2.

The configuration shown in FIG. 1, in which the magnetic circuit is in normal operation and the potentiometers 32 have been fully extended, is designated as configuration 1 or the first state.

The configuration shown in FIG. 2, in which the magnetic circuit is in an inoperable but easily disassembled state, is designated as configuration 2 or the second state. In the second state, the potentiometers 32 generate a shunt between the circuit legs and the pole shoes, or between the circuit legs and the permanent magnets. In principle, however, it is also possible to generate a shunt only between the circuit legs and the pole shoes, or only between the circuit legs and the permanent magnets, or to generate a shunt also with the aid of the circuit yoke.

The following Table I shows the results of the calculation of the disassembly force $F_Z$ and of the flux density $B_0$ in the center of the air gap in the two configurations.

TABLE I

| Configuration | Fz (N) | $B_0$ (mT) |
|---|---|---|
| 1 - normal operation, FIG. 1 | 450 | 330 |
| 2 - capable of being disassembled, FIG. 2 | 230 | 250 |

Table I shows that the disassembly force $F_Z$ is reduced by almost 50% through the use of the magnetic potentiometers 32. This halving of the force $F_Z$ to be applied permits substantially more comfortable and secure working in the course of assembly tasks and maintenance tasks.

At the same time, the decline in the disassembly force $F_Z$ is also accompanied by a decline in the flux density $B_0$ in the air gap. This diminution of the flux density is tantamount to a diminution of the resonant frequency of the spin feature—in concrete terms in the present case, by 24%. Since the bandwidth within which, for instance, a strip-line resonator of a sensor element is measurable typically amounts to less than 1% of the fundamental frequency, the combination of magnetic circuit and resonator in configuration 2 is no longer able to measure a specified spin-resonance security feature, given the considerable decline in the polarization field $B_0$. However, this is not a problem, since measurements of spin resonance are to be carried out only with the sensor element in configuration 1.

Besides a reduction of the disassembly forces, the use of the potentiometers 32 according to the invention also diminishes the arising stray fields of a disassembled magnetic circuit.

Figure 8:
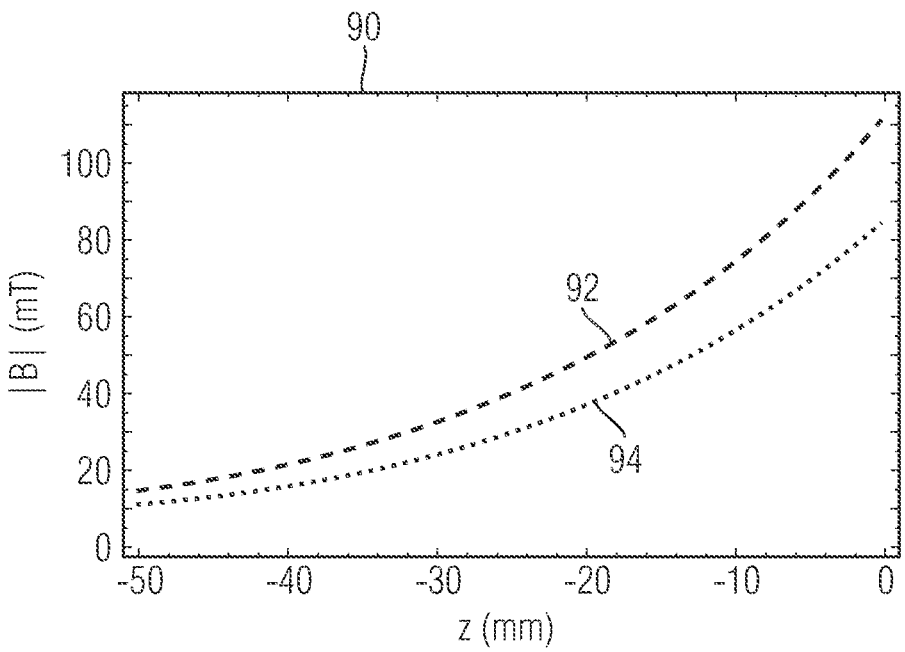
FIG. 8 shows the magnitude of the calculated stray fields of the upper circuit half of the sensor element along the central plumb line of the pole shoe in the two configurations shown in FIGS. 1 and 2.

For the purpose of illustration, the diagram 90 in FIG. 8 shows the magnitude of the calculated stray fields of the upper circuit half 16 of the sensor element 10 along the central plumb line of the pole shoe 26. The field progression in configuration 1 (FIG. 1) is represented as curve 92; the field progression in configuration 2 (FIG. 2) is represented as curve 94. The representation extends in the negative z-direction (that is to say, from top to bottom in FIGS. 1 and 2) and begins in the center of the air gap 24 at z=0. In both configurations, the lower circuit half 18 has been removed.

As is evident from FIG. 8, the stray fields in configuration 2 (curve 94) are lower than the stray fields in configuration 1 (curve 92) for all z-values. For instance, in the center of the air gap 24 at z=0 the stray field in configuration 2 is 24% lower, by virtue of the low magnetic reluctance of the potentiometers 32, than the stray field in configuration 1 at high potentiometer reluctances.

In a further simulation calculation, in the case of the sensor element 10 shown in FIGS. 1 and 2 the influence of the thread diameters or bolt diameters, and hence the influence of the magnetic potentiometer reluctance, on the disassembly force was investigated in greater detail.

For this purpose, the magnetic potentiometers 32 of the sensor element 10 were simulated with bolts having diameters d within the range between 2 mm and 20 mm, and the disassembly force in the z-direction was determined. The bores in the circuit legs were of such dimensions that they are filled out completely by the respective bolts.

Figure 9:
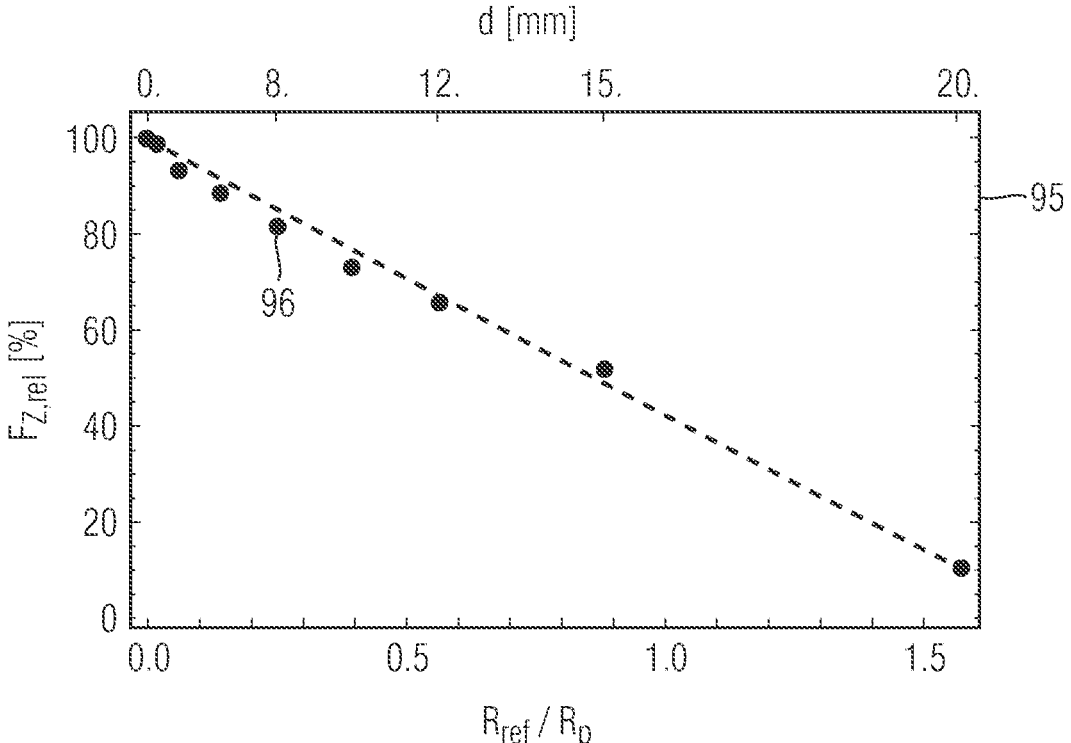
FIG. 9 shows the relative disassembly force $F_{Z,rel}$ of a magnetic circuit according to FIGS. 1 and 2 as a function of the bolt diameter d (upper x-axis) and of the ratio of the reference reluctance $R_{ref}$ in the magnetic circuit to the potentiometer reluctance $R_P$ of the potentiometers (lower x-axis).

The results of calculation are summarized and illustrated in the diagram 95 in FIG. 9. For each chosen bolt diameter d, represented on the upper x-axis, the disassembly force was calculated, both for fully screwed-in bolts (FIG. 2, minimum value of the potentiometer reluctance $R_P$) and for maximally unscrewed bolts (FIG. 1, maximum value of the potentiometer reluctance $R_P$).

FIG. 9 shows on the y-axis the relative disassembly force $F_{Z,rel}$—that is to say, for each bolt diameter d the disassembly force $F_{Z,min}$ at minimum potentiometer reluctance (second state, easy to disassemble) relative to the disassembly force at maximum potentiometer reluctance $F_{Z,max}$ (first state, normal operation). A relative disassembly force $F_{Z,re}$ of 100% corresponds to the disassembly force of the initial situation in FIG. 1 which was set up for measuring the spin resonance; a relative disassembly force of less than 100% indicates a corresponding diminution of the disassembly force in comparison with the initial situation.

On the lower x-axis, the ratio of the relevant reference reluctance $R_{ref}$ in the magnetic circuit to the minimum potentiometer reluctance $R_P$ of the potentiometers 32 in the second state, capable of being disassembled, has been plotted. The total reluctance of the bridged magnetic loopback between the two potentiometers of the upper and lower circuit halves has been used as relevant reference reluctance $R_{ref}$.

From the representation shown in FIG. 9, it is evident that potentiometer elements with a reluctance ratio $R_{ref}/R_P=0.33$ (corresponding to $R_P=3*R_{ref}$) already reduce the disassembly force by about 20% (roughly corresponding to data point 96). With further declining magnetic reluctance—that is to say, with increasing bolt diameter d—the reduction of the disassembly force continues. In the case of bolts having a very large diameter d, in particular with $R_{ref}/R_P \geq 1$, the disassembly force is reduced by about 60% and disappears almost completely in the case of a still larger bolt diameter.

With a further simulation calculation, the magnetic circuit of the sensor element 70 shown in FIGS. 5 and 6 was investigated in greater detail. In normal operation (FIG. 5), the loopback, the pole shoes and the permanent magnets being used are identical to the magnetic circuit shown in FIGS. 1 and 2. In the following, this configuration will be designated as configuration 1 or the first state. Unlike the latter, however, the sensor element 70 exhibits vertical disassembly gaps 72 with which the H-type circuit can be converted into a C-type circuit by dismantling of a leg 74.

For the purpose of facilitating the dismantling, soft-magnetic threaded rods, each with a diameter of 10 mm, are located close to the two disassembly gaps 72. In normal operation shown in FIG. 5, the threaded rods have been screwed into the loopback. For the purpose of dismantling the circuit leg 74, the threaded rods can be screwed halfway out of the loopback, as illustrated in FIG. 6. In addition, a soft-magnetic plate 86, for instance having dimensions of 30 mm×10 mm×140 mm, can be attached to the right circuit leg 76. For the calculation, both the threaded rods 82 of the potentiometer and the plate 86 of the potentiometer have been manufactured from the same soft-magnetic steel as the pole shoes and the loopback. In the following, this configuration will be designated as configuration 2 or the second state.

For this magnetic circuit, the disassembly force $F_z$ was again calculated, the disassembly force in this exemplary embodiment representing the force that is at least necessary to pull the left circuit leg 74 in the negative y-direction away from the circuit (that is to say, to the left in FIGS. 5(*b*) and 6(*b*)).

The calculation was performed for the two configurations represented in FIGS. 5 and 6 with the differing states of the potentiometers 80, 84.

TABLE II

| Configuration | Fz (N) |
|---|---|
| 1 - normal operation, FIG. 5 | 756 |
| 2 - capable of being disassembled, FIG. 6 | 467 |

From Table II it is evident that by virtue of the potentiometers 80, 84 the necessary disassembly force for pulling the circuit leg 74 away can be reduced by almost 40%.

In addition, in the configuration shown in FIG. 6 the magnetic circuit exhibits a considerable asymmetry in structure. This asymmetry is also reflected in the distribution of the magnetic flux in the circuit, and ultimately results in an asymmetrical $B_0$ distribution in the air gap. This is tantamount to a poor field homogeneity, which makes a banknote measurement difficult. However, this is not a problem, since measurements of spin resonance are to be carried out only with the sensor element in configuration 1.

The invention claimed is:

1. A sensor element for the inspection of a planar data-carrier having a spin-resonance feature, comprising:

a magnetic core with an air gap, into which the planar data-carrier is capable of being inserted for the purpose of inspection, and with at least one disassembly gap along which the magnetic core is capable of being disassembled into two or more parts, and a polarizing device for generating a static magnetic flux in the air gap, wherein the magnetic core exhibits at least one magnetic potentiometer capable of being switched between two states, wherein in a first state the magnetic potentiometer exhibits a first magnetic reluctance, and in the first state of the magnetic potentiometer the sensor element has been set up for a measurement in respect of a spin-resonance feature of a data-carrier inserted into the air gap, and in a second state the magnetic potentiometer exhibits a second magnetic reluctance, different from the first magnetic reluctance, and in the second state of the magnetic potentiometer the sensor element has been set up for a disassembly of the magnetic core along the disassembly gap.

2. The sensor element according to claim 1, wherein the at least one magnetic potentiometer has been designed in such a way that in the first state it has substantially no influence on the magnetic flux in the air gap.

3. The sensor element according to claim 1, wherein the disassembly force for disassembling the magnetic core along the at least one disassembly gap is at least 20% smaller in the second state, at least 40% smaller, than the disassembly force in the first state.

4. The sensor element according to claim 1, wherein for a disassembly of the magnetic core a magnetic conductor with a magnetic reluctance Rref has to be bridged with the aid of a magnetic potentiometer, the magnetic potentiometer being connected in parallel to the conductor to be bridged.

5. The sensor element according to claim 4, wherein the magnetic potentiometer in the first state exhibits a magnetic reluctance RP of at least 10*Rref.

6. The sensor element according to claim 4, wherein the magnetic potentiometer in the second state exhibits a magnetic reluctance RP of at most 3*Rref.

7. The sensor element according to claim 1, wherein for a disassembly of the magnetic core a magnetic conductor with a magnetic reluctance Rref has to be switched to be flux-free with the aid of a magnetic potentiometer, the magnetic potentiometer being connected in series with the conductor to be switched to be flux-free.

8. The sensor element according to claim 7, wherein the magnetic potentiometer in the first state exhibits a magnetic reluctance RP of at most ⅓*Rref.

9. The sensor element according to claim 7, wherein the magnetic potentiometer in the second state exhibits a magnetic reluctance RP of at least 3*Rref.

10. The sensor element according to claim 1, wherein in the second state of the magnetic potentiometer the magnetic flux through the air gap has been changed by more than 5% in comparison with the magnetic flux in the first state, and/or in that the field homogeneity in the air gap has been diminished by more than 10%.

11. The sensor element according to claim 1, wherein two or more magnetic potentiometers, at least two magnetic potentiometers of different types, have been provided.

12. The sensor element according to claim 1, wherein at least one magnetic potentiometer of the magnetic core includes two spaced magnetic conductors and a magnetic flux-conducting part which extends with variable length within the free space between the two conductors in order to generate a variable magnetic reluctance, depending on the length of the flux-conducting part.

13. The sensor element according to claim 1, wherein at least one magnetic potentiometer of the magnetic core includes two spaced magnetic conductors and a flux-conducting part extending between the conductors with an enclosed magnetic modification element that is capable of being variably positioned in the flux-conducting part in order to generate a variable magnetic reluctance, depending on the position of the modification element in the flux-conducting part.

14. The sensor element according to claim 1, wherein at least one magnetic potentiometer of the magnetic core includes two spaced magnetic conductors and a flux-conducting part extending between the conductors that is capable of being combined with a magnetic modification plate in order to generate a variable magnetic reluctance, depending on the presence or absence of the modification plate.

15. The sensor element according to claim 1, wherein the sensor element exhibits a modulation coil, for generating a temporally varying magnetic field in the air gap, and a resonator for exciting the spin-resonance feature of the data-carrier to be inspected.

16. A method for disassembling a sensor element according to claim 1, in which the at least one magnetic potentiometer of the magnetic core is brought into the second state and the magnetic core is disassembled along the at least one disassembly gap.

17. A method for assembling a sensor element according to claim 1, wherein:

a first portion of the magnetic core is made available that exhibits at least a part of the stated polarizing device for generating the static magnetic flux and that exhibits at least one magnetic potentiometer capable of being switched between two states, which is in the second state or is brought into the second state, a second portion of the magnetic core is made available, the magnetic core of the sensor element is assembled from the first and second portions, so that, on the one hand, an air gap is formed in the magnetic core, in which a static magnetic flux is generated by the polarizing device, and, on the other hand, at least one disassembly gap is formed between the portions, after the assembly of the magnetic core, the at least one magnetic potentiometer is brought into the first state in order to set up the sensor element for a measurement in respect of a spin-resonance feature of a data-carrier inserted into the air gap.

18. A method for inspecting a planar data-carrier having a spin-resonance feature by means of a sensor element according to claim 1, in which:

an inspection is made as to whether the at least one magnetic potentiometer of the magnetic core is in the first state, and if this is not the case the magnetic potentiometer is brought into the first state, and a planar data-carrier to be inspected is inserted into the air gap of the magnetic core, and a measurement of spin resonance is performed in respect of the data-carrier.

\* \* \* \* \*